United States Patent
Shimauchi et al.

(10) Patent No.: US 10,969,425 B2
(45) Date of Patent: Apr. 6, 2021

(54) SEMICONDUCTOR INTEGRATED CIRCUIT AND ROTATION DETECTION DEVICE

(71) Applicant: Mitsubishi Electric Corporation, Tokyo (JP)

(72) Inventors: Hideki Shimauchi, Tokyo (JP); Akio Kamimurai, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 49 days.

(21) Appl. No.: 16/442,622

(22) Filed: Jun. 17, 2019

(65) Prior Publication Data

US 2020/0033400 A1 Jan. 30, 2020

(30) Foreign Application Priority Data

Jul. 25, 2018 (JP) .............................. JP2018-138935

(51) Int. Cl.
*G01R 31/28* (2006.01)

(52) U.S. Cl.
CPC ................................ *G01R 31/2856* (2013.01)

(58) Field of Classification Search
CPC ............ G01R 31/2856; G01R 31/2843; G06F 11/2284
USPC ....... 324/754.07, 754.03, 754.01, 537, 750.3
See application file for complete search history.

(56) References Cited

U.S. PATENT DOCUMENTS

| | | | | |
|---|---|---|---|---|
| 6,774,639 B1* | 8/2004 | Unsworth | .......... | G01R 31/1227 324/547 |
| 7,532,012 B2* | 5/2009 | Cern | .................. | G01R 31/1272 324/536 |
| 7,676,333 B2* | 3/2010 | Younsi | ............... | G01R 31/1227 702/58 |
| 9,640,467 B2* | 5/2017 | Schillinger | ....... | H01L 23/49541 |

(Continued)

FOREIGN PATENT DOCUMENTS

| JP | 8129495 A | 5/1996 |
|---|---|---|
| JP | 2016126692 A | 7/2016 |

(Continued)

OTHER PUBLICATIONS

Communication dated Jul. 30, 2019, from the Japanese Patent Office in application No. 2018-138935.

*Primary Examiner* — Giovanni Astacio-Oquendo
(74) *Attorney, Agent, or Firm* — Sughrue Mion, PLLC; Richard C. Turner (57) ABSTRACT

A semiconductor integrated circuit includes: a main circuit; a non-volatile memory; and a self-diagnosis circuit configured to execute, when the semiconductor integrated circuit is to be powered off, self-diagnosis processing in which the main circuit is diagnosed and a diagnosis execution record indicating whether the diagnosis is completed and a diagnosis result indicating a result of the diagnosis are stored in the non-volatile memory. The self-diagnosis circuit is configured to: determine, when the semiconductor integrated circuit is powered on, whether there is a failure in the main circuit by reading the diagnosis execution record and the (Continued)

diagnosis result out of the non-volatile memory; and shift a state of the main circuit to a safe state when determining that there is a failure in the main circuit, and instruct the main circuit to start normal operation when determining that there is no failure in the main circuit.

17 Claims, 8 Drawing Sheets

(56) References Cited

U.S. PATENT DOCUMENTS

| | | | |
|---|---|---|---|
| 2008/0290482 A1* | 11/2008 | Bayan | H01L 23/49572 257/670 |
| 2012/0206888 A1* | 8/2012 | Schillinger | G01D 11/245 361/760 |

FOREIGN PATENT DOCUMENTS

| | | | |
|---|---|---|---|
| JP | 2016-176843 A | 10/2016 | |
| JP | 2017-091442 A | 5/2017 | |
| JP | 2017091047 A | 5/2017 | |
| JP | 6298899 B2 | 3/2018 | |

* cited by examiner

SEMICONDUCTOR INTEGRATED CIRCUIT AND ROTATION DETECTION DEVICE

BACKGROUND OF THE INVENTION

1. Field of the Invention

The present invention relates to a semiconductor integrated circuit including a self-diagnosis circuit, and a rotation detection device including the semiconductor integrated circuit.

2. Description of the Related Art

In recent years, a high level of safety is demanded by a function of a semiconductor integrated circuit to be used in an automobile, or the like. For instance, ISO 26262 is given as a functional safety standard for automobiles. It is accordingly required to implement a function for fulfilling functional safety demands in the semiconductor integrated circuit.

As this function, a self-diagnosis function also called Built-in Self-Test (BIST) is implemented in the semiconductor integrated circuit in some cases. The self-diagnosis function is, generally, configured to operate when the semiconductor integrated circuit is powered on (see Japanese Patent Application Laid-open No. 2016-176843, for example). When a failure in the semiconductor integrated circuit is detected by the self-diagnosis function, the functional safety demands can be satisfied by shifting the semiconductor integrated circuit and its host system to a safe state. The safe state means an "operating mode of a system implemented with a function without an unreasonable level of risk," as defined by ISO 26262, for example, an intended operating mode, a degraded operating mode, or a switch-off mode.

A start-up time that is a time required for the function of the semiconductor integrated circuit to start operating after the semiconductor integrated circuit is powered on, is sometimes restricted due to the host system. There may be a case in which the running time of the self-diagnosis function is prolonged in order to accomplish a high ratio of failure detection of the semiconductor integrated circuit.

Thus, in a case in which there is a restriction on the start-up time of the semiconductor integrated circuit, when the running time of the self-diagnosis function is long, the operation of the self-diagnosis function may not be completed in the start-up time. As a result, there is a risk in that a failure in the semiconductor integrated circuit may not be detected.

SUMMARY OF THE INVENTION

The present invention has been made to solve the problem described above, and an object of the present invention is therefore to provide a semiconductor integrated circuit capable of detecting a failure in the semiconductor integrated circuit even when there is a restriction on a start-up time of the semiconductor integrated circuit, and a rotation detection device including the semiconductor integrated circuit.

According to one embodiment of the present invention, there is provided a semiconductor integrated circuit, including: a main circuit; a non-volatile memory; and a self-diagnosis circuit configured to execute, when the semiconductor integrated circuit is to be powered off, self-diagnosis processing in which the main circuit is diagnosed and a diagnosis execution record indicating whether the diagnosis is finished and a diagnosis result indicating a result of the diagnosis are stored in the non-volatile memory, in which the self-diagnosis circuit is configured to: determine, when the semiconductor integrated circuit is powered on, whether there is a failure in the main circuit by reading the diagnosis execution record and the diagnosis result out of the non-volatile memory; and shift a state of the main circuit to a safe state when determining that there is a failure in the main circuit, and instruct the main circuit to start normal operation when determining that there is no failure in the main circuit.

According to one embodiment of the present invention, there is provided a semiconductor integrated circuit, including: a main circuit; and a self-diagnosis circuit configured to execute, when the semiconductor integrated circuit is to be powered off, self-diagnosis processing in which the main circuit is diagnosed and a diagnosis execution record indicating whether the diagnosis is finished and a diagnosis result indicating a result of the diagnosis are stored in a non-volatile memory of an external control device, in which the external control device is configured to: determine, when the semiconductor integrated circuit is powered on, whether there is a failure in the main circuit by reading the diagnosis execution record and the diagnosis result out of the non-volatile memory; and issue a command signal for shifting a state of the main circuit to a safe state to the main circuit when determining that there is a failure in the main circuit, and issue a command signal for causing the main circuit to start normal operation to the main circuit when determining that there is no failure in the main circuit.

According to the present invention, the semiconductor integrated circuit capable of detecting the failure in the semiconductor integrated circuit even when there is a restriction on the start-up time of the semiconductor integrated circuit, and the rotation detection device including the semiconductor integrated circuit can be obtained.

DESCRIPTION OF THE EMBODIMENTS

Referring to the accompanying drawings, a semiconductor integrated circuit and a rotation detection device according to exemplary embodiments of the present invention are described below. In descriptions of the drawings, the same parts or corresponding parts are denoted by the same reference symbols, and a redundant description is omitted.

First Embodiment

Figure 1:
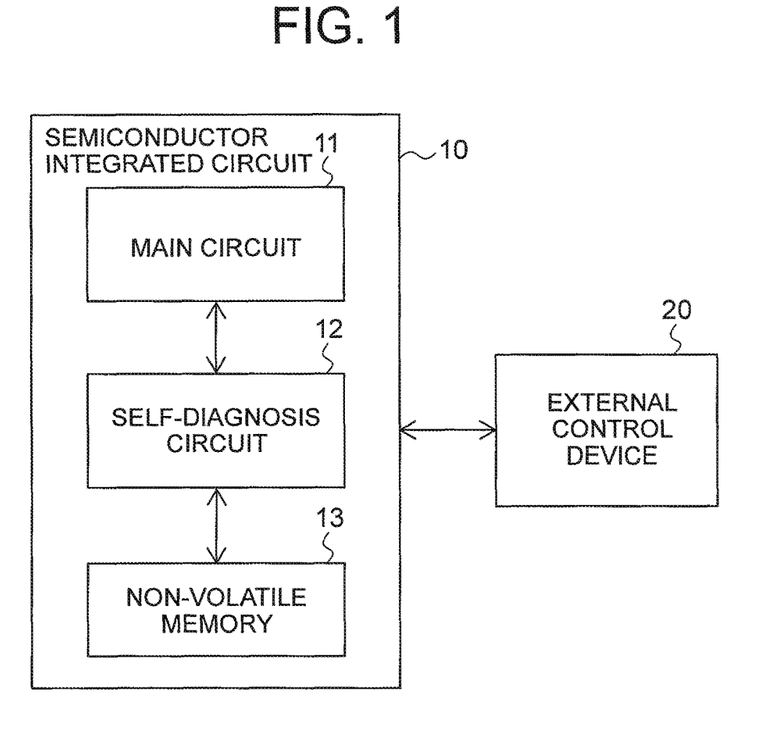
FIG. 1 is a block diagram for illustrating a semiconductor integrated circuit according to a first embodiment of the present invention.

FIG. 1 is a block diagram for illustrating a semiconductor integrated circuit 10 according to a first embodiment of the present invention. As illustrated in FIG. 1, the semiconductor integrated circuit 10 is connected to an external control device 20 in a manner that allows communication between the semiconductor integrated circuit 10 and the external control device 20. The semiconductor integrated circuit 10 includes a main circuit 11, which implements various functions installed in a general semiconductor integrated circuit, a self-diagnosis circuit 12, which executes self-diagnosis processing described later, and a non-volatile memory 13, which is electrically rewritable. The external control device 20 transmits, to the semiconductor integrated circuit 10, a control signal for controlling the semiconductor integrated circuit 10 from the outside, and receives, from the semiconductor integrated circuit 10, an output signal that is output by the semiconductor integrated circuit 10.

Figure 2:
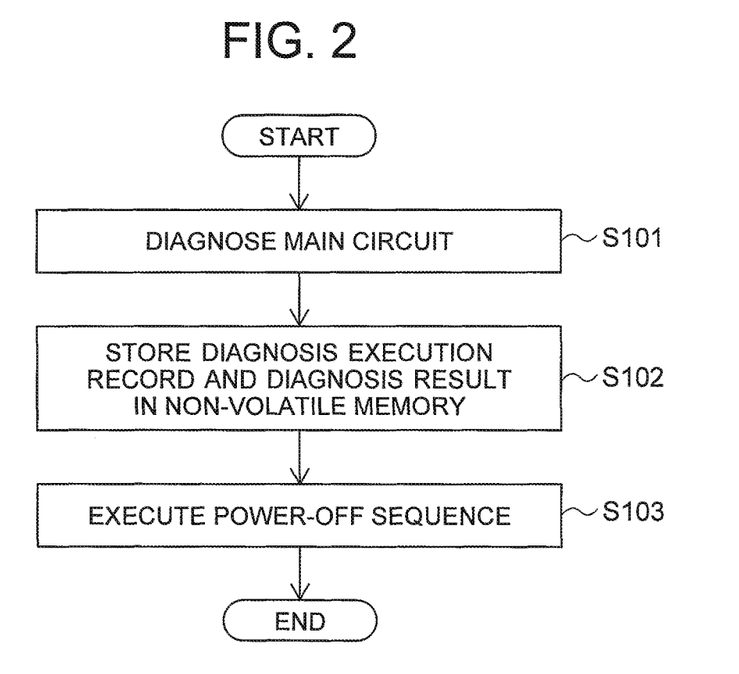
FIG. 2 is a flow chart for illustrating a series of steps of self-diagnosis processing that is executed by a self-diagnosis circuit of the semiconductor integrated circuit according to the first embodiment of the present invention.

FIG. 2 is a flow chart for illustrating a series of steps of self-diagnosis processing that is executed by the self-diagnosis circuit 12 of the semiconductor integrated circuit 10 according to the first embodiment of the present invention. The processing illustrated in the flow chart of FIG. 2 is executed when the semiconductor integrated circuit 10 is powered off.

In Step S101, the self-diagnosis circuit 12 diagnoses the main circuit 11. The processing then proceeds to Step S102. The diagnosis is for checking whether there is a failure in the main circuit 11.

In Step S102, the self-diagnosis circuit 12 stores, in the non-volatile memory 13, a diagnosis execution record, which indicates whether the diagnosis conducted in Step S101 has been completed, and a diagnosis result, which indicates the outcome of the diagnosis conducted in Step S101. The processing then proceeds to Step S103.

In Step S103, the self-diagnosis circuit 12 commands the main circuit 11 to execute a power-off sequence for powering off the semiconductor integrated circuit 10. The processing is then ended. The power-off sequence is a general sequence for cutting off the power of the semiconductor integrated circuit 10, and is a sequence determined in advance.

In this manner, when the semiconductor integrated circuit 10 is to be powered off, the self-diagnosis circuit 12 executes the self-diagnosis processing in which the main circuit 11 is diagnosed, and the diagnosis execution record indicating whether the diagnosis is completed and the diagnosis result indicating the outcome of the diagnosis are stored in the non-volatile memory 13. The self-diagnosis circuit 12 subsequently instructs the main circuit 11 to execute the power-off sequence. This powers off the semiconductor integrated circuit 10.

Figure 3:
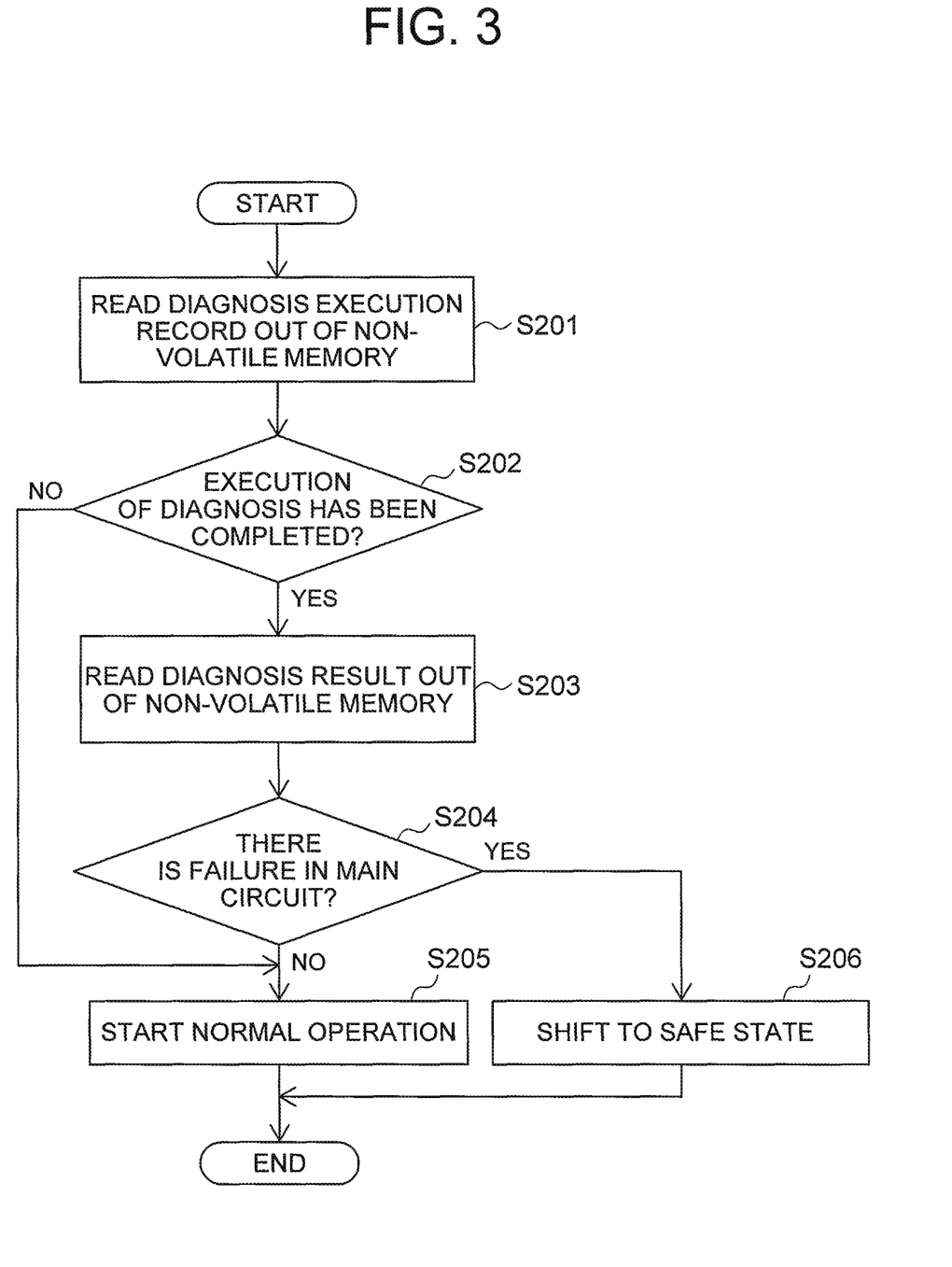
FIG. 3 is a flow chart for illustrating a series of steps of self-diagnosis result determination processing that is executed by the self-diagnosis circuit of the semiconductor integrated circuit according to the first embodiment of the present invention.

FIG. 3 is a flow chart for illustrating a series of steps of self-diagnosis result determination processing that is executed by the self-diagnosis circuit 12 of the semiconductor integrated circuit 10 according to the first embodiment of the present invention. The processing illustrated in the flow chart of FIG. 3 is executed when the semiconductor integrated circuit 10 is powered on.

In Step S201, the self-diagnosis circuit 12 reads the diagnosis execution record out of the non-volatile memory 13. The processing then proceeds to Step S202.

In Step S202, the self-diagnosis circuit 12 determines whether the execution of the diagnosis has been completed from the diagnosis execution record read in Step S201. When it is determined that the execution of the diagnosis has been completed, the processing proceeds to Step S203. When it is determined that the execution of the diagnosis has not been completed, the processing proceeds to Step S205.

When the diagnosis execution record read in Step S201 indicates that the diagnosis has not been completed, it is conceivable that the operation of the semiconductor integrated circuit 10 has stopped due to a drop in the power supply voltage of the semiconductor integrated circuit 10 or other anomalies that have occurred in the semiconductor integrated circuit 10. Accordingly, when the execution of the diagnosis is uncompleted, the self-diagnosis circuit 12 does not read the diagnosis result out of the non-volatile memory 13, and instructs the main circuit 11 to start normal operation as described later.

When the diagnosis execution record read in Step S201 indicates that the diagnosis has been completed, on the other hand, the self-diagnosis circuit 12 reads the diagnosis result out of the non-volatile memory 13, and controls the main circuit 11 based on the read diagnosis result as described later.

In Step S203, the self-diagnosis circuit 12 reads the diagnosis result out of the non-volatile memory 13. The processing then proceeds to Step S204.

In Step S204, the self-diagnosis circuit 12 determines whether there is a failure in the main circuit 11 from the diagnosis result read in Step S203. When it is determined that there is a failure in the main circuit 11, the processing proceeds to step S206. When it is determined that there is no failure in the main circuit 11, the processing proceeds to Step S205.

In Step S205, the self-diagnosis circuit 12 commands the main circuit 11 to start normal operation. The processing is then ended.

In Step S206, the self-diagnosis circuit 12 commands the main circuit 11 to shift the state of the main circuit 11 to a safe state. The processing is then ended. The safe state here is a state in which the main circuit 11 experiencing a failure meets the functional safety demands described above.

In this manner, once the semiconductor integrated circuit 10 is powered on, the self-diagnosis circuit 12 determines whether there is a failure in the main circuit by reading the diagnosis execution record and the diagnosis result out of the non-volatile memory 13.

When determining as a result of the determination described above that there is a failure in the main circuit 11, the self-diagnosis circuit 12 shifts the state of the main circuit 11 to the safe state. That is, the self-diagnosis circuit 12 shifts the state of the main circuit 11 to the safe state when the diagnosis result read out of the non-volatile memory 13 indicates a failure in the main circuit 11. The main circuit 11 experiencing a failure thus shifts to the safe state without starting normal operation.

When determining as a result of the determination described above that there is no failure in the main circuit 11, the self-diagnosis circuit 12 commands the main circuit 11 to start normal operation. That is, the self-diagnosis circuit 12 instructs the main circuit 11 to start normal operation when the diagnosis result read out of the non-volatile memory 13 indicates no failure in the main circuit 11. The main circuit 11 working normally thus starts normal operation.

As described above, according to the first embodiment, the self-diagnosis circuit of the semiconductor integrated circuit is configured to execute the self-diagnosis processing when the semiconductor integrated circuit is to be powered off. The self-diagnosis circuit is also configured to determine whether there is a failure in the main circuit by reading the diagnosis execution record and the diagnosis result out of the non-volatile memory when the semiconductor integrated circuit is powered on. The self-diagnosis circuit is further configured to shift the state of the main circuit to the safe state when determining that there is a failure in the main circuit in the determination, and instructs the main circuit to start normal operation when determining that there is no failure in the main circuit in the determination.

This ensures that the determination of the diagnosis result is executed at the time the semiconductor integrated circuit is activated, by reading the result of executing the self-diagnosis processing out of the non-volatile memory. A failure in the semiconductor integrated circuit can accordingly be detected even when the start-up time demanded by a host system is short. In other words, a failure in the semiconductor integrated circuit can be detected even when there is a restriction on the start-up time of the semiconductor integrated circuit. The functional safety demands for the semiconductor integrated circuit can consequently be met.

Second Embodiment

In a second embodiment of the present invention, a description is given on a semiconductor integrated circuit 10 that includes a low-voltage detection circuit 14 in addition to the configuration of the first embodiment described above. In the second embodiment, a description on aspects that are the same as those in the first embodiment described above is omitted, and differences from the first embodiment described above are mainly described.

Figure 4:
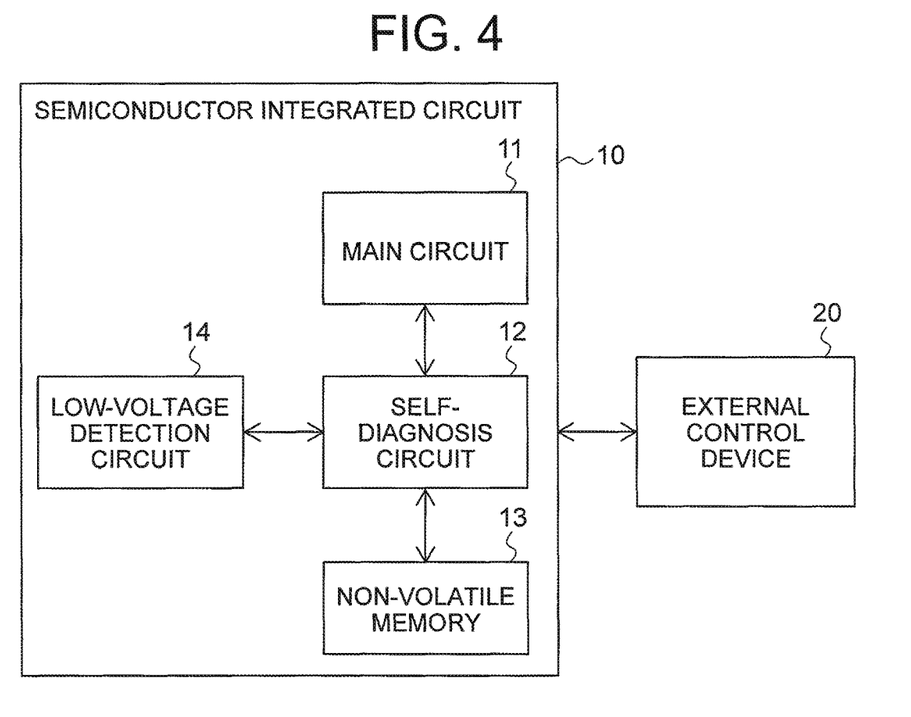
FIG. 4 is a block diagram for illustrating a semiconductor integrated circuit according to a second embodiment of the present invention.

FIG. 4 is a block diagram for illustrating the semiconductor integrated circuit 10 according to the second embodiment of the present invention. As illustrated in FIG. 4, the semiconductor integrated circuit 10 includes a main circuit 11, a self-diagnosis circuit 12, a non-volatile memory 13, and the low-voltage detection circuit 14.

An Under Voltage Lock Out (UVLO) circuit is installed in some semiconductor integrated circuits in order to prevent the semiconductor integrated circuits from malfunctioning when the power supply voltage drops. When detecting that the power supply voltage of a semiconductor integrated circuit installed with the UVLO circuit has dropped to a set voltage A or lower, the UVLO circuit stops the operation of the semiconductor integrated circuit in order to avoid a malfunction of the semiconductor integrated circuit. The set voltage A is a value set in advance so that a malfunction of the semiconductor integrated circuit is avoided despite a drop in power supply voltage.

When the UVLO circuit described above is installed in the semiconductor integrated circuit 10, the UVLO circuit stops the operation of the semiconductor integrated circuit 10 upon detection of a drop in the power supply voltage of the semiconductor integrated circuit 10 to the set voltage A or lower. In other words, a drop in the power supply voltage of the semiconductor integrated circuit 10 to the set voltage A or lower hinders the self-diagnosis circuit 12 from executing self-diagnosis processing normally.

The low-voltage detection circuit 14 outputs a start signal to the self-diagnosis circuit 12 when detecting that the power supply voltage of the semiconductor integrated circuit 10 has dropped to a set voltage B, which is higher than the set voltage A, or lower. The set voltage B is a value set in advance so that the self-diagnosis processing can be executed normally despite a drop in power supply voltage. The start signal is a signal for commanding the self-diagnosis circuit 12 to start executing the self-diagnosis processing.

The self-diagnosis circuit 12 starts executing the self-diagnosis processing described above when the start signal is input from the low-voltage detection circuit 14.

In this manner, when the power supply voltage of the semiconductor integrated circuit 10 drops, the low-voltage detection circuit 14 detects the drop in power supply voltage within a range of power supply voltage values at which the self-diagnosis processing can be executed normally, before the function of the UVLO circuit is put into operation, and causes the self-diagnosis circuit 12 to execute the self-diagnosis processing.

As described above, according to the second embodiment, the semiconductor integrated circuit includes the low-voltage detection circuit, which outputs a start signal when detecting that the power supply voltage has dropped to a set voltage, in addition to the configuration of the first embodiment described above. The self-diagnosis circuit is configured to start executing self-diagnosis processing when the start signal is input to the self-diagnosis circuit. This enables the semiconductor integrated circuit to stably execute self-diagnosis processing when the semiconductor integrated circuit is to be powered off.

Third Embodiment

In a third embodiment of the present invention, a description is given on a semiconductor integrated circuit 10 that includes a voltage holding circuit 15 in addition to the configuration of the second embodiment described above. In the third embodiment, a description on aspects that are the same as those in the first and second embodiments described above is omitted, and differences from the first and second embodiments described above are mainly described.

Figure 5:
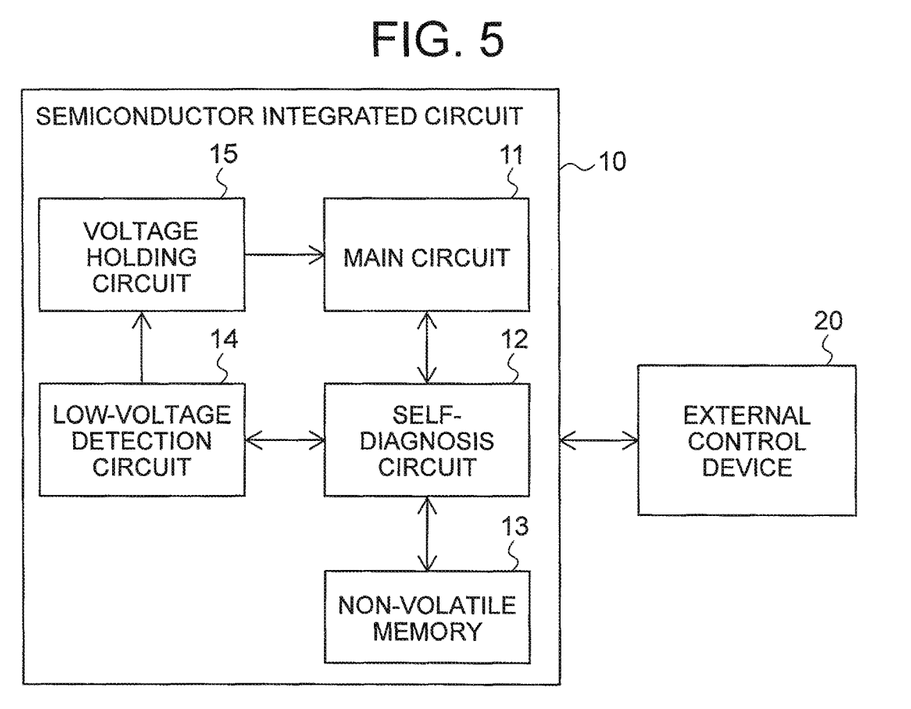
FIG. 5 is a block diagram for illustrating a semiconductor integrated circuit according to a third embodiment of the present invention.

FIG. 5 is a block diagram for illustrating the semiconductor integrated circuit 10 according to the third embodiment of the present invention. As illustrated in FIG. 5, the semiconductor integrated circuit 10 includes a main circuit 11, a self-diagnosis circuit 12, a non-volatile memory 13, a low-voltage detection circuit 14, and the voltage holding circuit 15.

When detecting that the power supply voltage of the semiconductor integrated circuit 10 has dropped to the set voltage B, the low-voltage detection circuit 14 outputs the start signal to the self-diagnosis circuit 12 and also outputs a detection signal to the voltage holding circuit 15. When the detection signal is input from the low-voltage detection circuit 14, that is, when a drop in the power supply voltage of the semiconductor integrated circuit 10 is detected by the low-voltage detection circuit 14, the voltage holding circuit 15 prevents a further drop in power supply voltage. The detection signal is a signal for notifying the voltage holding circuit 15 that a drop in power supply voltage has been detected.

Figure 6:
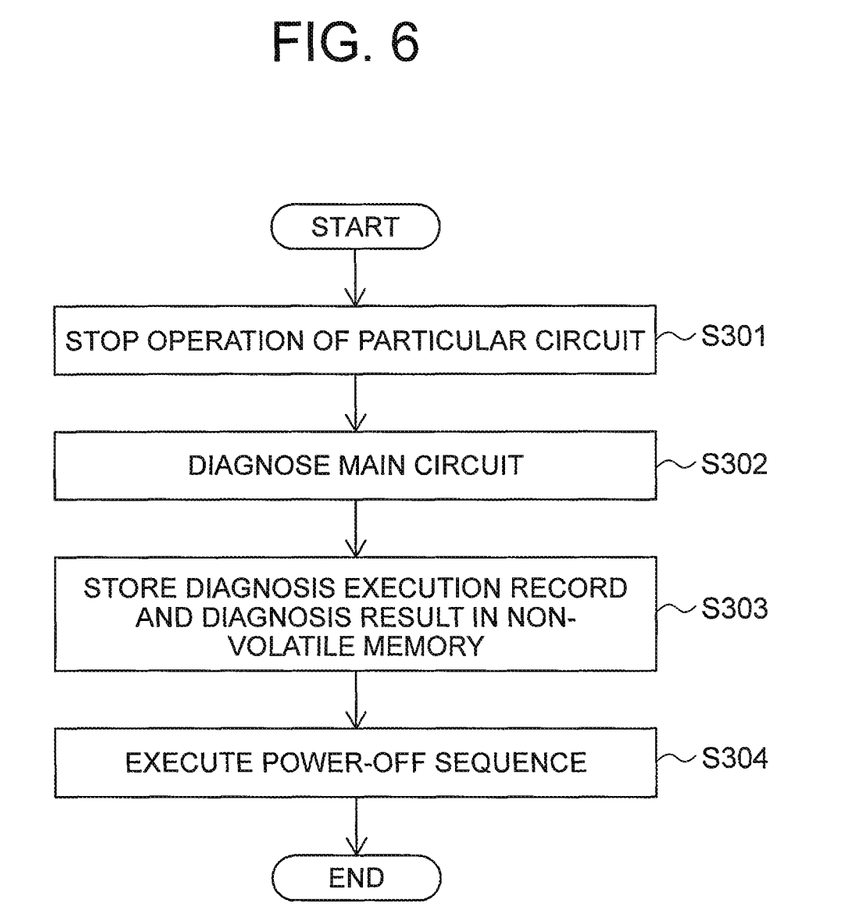
FIG. 6 is a flow chart for illustrating a series of steps of self-diagnosis processing that is executed by a self-diagnosis circuit of the semiconductor integrated circuit according to the third embodiment of the present invention.

FIG. 6 is a flow chart for illustrating a series of steps of self-diagnosis processing that is executed by the self-diagnosis circuit 12 of the semiconductor integrated circuit 10 according to the third embodiment of the present invention. The processing illustrated in the flow chart of FIG. 6 is executed when a drop in power supply voltage is detected by the low-voltage detection circuit 14.

In Step S301, the voltage holding circuit 15 stops the operation of a particular circuit in the main circuit 11. The processing then proceeds to Step S302. The particular circuit is a circuit that does not affect the execution of the self-diagnosis processing by the self-diagnosis circuit 12, and is a circuit determined in advance.

The voltage holding circuit 15 thus prevents a further drop in the power supply voltage of the semiconductor integrated circuit 10 by stopping the operation of a particular circuit in the main circuit 11. This prevents a situation in which the operation of the semiconductor integrated circuit 10 is stopped while the self-diagnosis processing is being executed.

In Step S302, the self-diagnosis circuit 12 diagnoses the main circuit 11. The processing then proceeds to Step S303.

In Step S303, the self-diagnosis circuit 12 stores, in the non-volatile memory 13, a diagnosis execution record, which indicates that the diagnosis conducted in Step S302 has been completed, and a diagnosis result, which indicates the outcome of the diagnosis conducted in Step S302. The processing then proceeds to Step S304.

In Step S304, the self-diagnosis circuit 12 commands the main circuit 11 to execute a power-off sequence for powering off the semiconductor integrated circuit 10. The processing is then ended.

In this manner, the low-voltage detection circuit 14 outputs the detection signal as well as the start signal when detecting a drop in power supply voltage to the set voltage. When the detection signal is input, the voltage holding circuit 15 stops the operation of a particular circuit in the main circuit 11.

While the voltage holding circuit 15 in the example given in the third embodiment is configured to prevent a drop in the power supply voltage of the semiconductor integrated circuit 10 by stopping the operation of a particular circuit in the main circuit 11, the voltage holding circuit 15 is not limited thereto.

Instead of being configured to stop the operation of a particular circuit in the main circuit 11, the voltage holding circuit 15 may include a capacitor that prevents the power supply voltage of the semiconductor integrated circuit 10 from dropping. The capacitor may be installed in the semiconductor integrated circuit 10 or may be provided outside the semiconductor integrated circuit 10.

As described above, according to the third embodiment, the semiconductor integrated circuit includes the voltage holding circuit, which prevents a drop in power supply voltage, in addition to the configurations of the first and second embodiments described above. An example of the voltage holding circuit is configured to stop the operation of a particular circuit in the main circuit upon input of the detection signal, which is output when a drop in power supply voltage to a set voltage is detected by the low-voltage detection circuit. Another example of the voltage holding circuit includes a capacitor.

This prevents a situation in which the operation of the semiconductor integrated circuit is stopped while the self-diagnosis processing is being executed.

Fourth Embodiment

In a fourth embodiment of the present invention, a description is given on a semiconductor integrated circuit 10 that has the configurations of the first to third embodiments described above minus the non-volatile memory 13. In the fourth embodiment, a description on aspects that are the same as those in the first to third embodiments described above is omitted, and differences from the first to third embodiments described above are mainly described.

Figure 7:
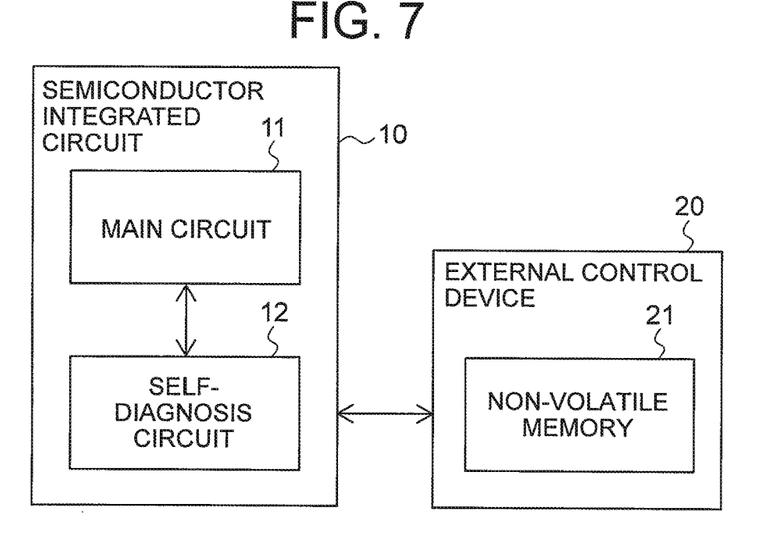
FIG. 7 is a block diagram for illustrating a semiconductor integrated circuit according to a fourth embodiment of the present invention.

FIG. 7 is a block diagram for illustrating the semiconductor integrated circuit 10 according to the fourth embodiment of the present invention. As illustrated in FIG. 7, the semiconductor integrated circuit 10 includes a main circuit 11 and self-diagnosis circuit 12. An external control device 20 transmits a control signal to the semiconductor integrated circuit 10, and receives an output signal from the semiconductor integrated circuit 10 as in the first embodiment described above. The external control device 20 also includes a non-volatile memory 21.

As opposed to the configurations of the first to third embodiments described above, the self-diagnosis circuit 12 stores the diagnosis execution record and diagnosis result obtained by diagnosing the main circuit 11 in the non-volatile memory 21 of the external control device 20, instead of the non-volatile memory 13. The self-diagnosis circuit 12 in this case gives the diagnosis execution record and the diagnosis result to the external control device 20. The external control device 20 stores the diagnosis execution record and diagnosis result obtained from the self-diagnosis circuit 12 in the non-volatile memory 21.

In this manner, when the semiconductor integrated circuit 10 is to be powered off, the self-diagnosis circuit 12 executes self-diagnosis processing in which the main circuit 11 is diagnosed, and the diagnosis execution record indicating whether the diagnosis is completed and the diagnosis result indicating the outcome of the diagnosis are stored in the non-volatile memory 21.

When the semiconductor integrated circuit 10 is powered on, the external control device 20 reads the diagnosis execution record and the diagnosis result out of the non-volatile memory 21 in the same manner as in Steps S201 to S204 of FIG. 3 described above. The external control device 20 determines whether there is a failure in the main circuit 11 of the semiconductor integrated circuit 10 by reading the diagnosis execution record and the diagnosis result out of the non-volatile memory 21.

When determining that there is a failure in the main circuit 11, the external control device 20 issues a command signal for shifting the state of the main circuit 11 to the safe state to the main circuit 11. This shifts the state of the main circuit 11 to the safe state.

When determining that there is no failure in the main circuit 11, the external control device 20 issues a command signal for instructing the main circuit 11 to start normal operation to the main circuit 11. With this instruction, the main circuit 11 starts normal operation.

As described above, according to the fourth embodiment, the self-diagnosis circuit of the semiconductor integrated circuit is configured to store the diagnosis execution record and the diagnosis result in the non-volatile memory of the external control device unlike in the first embodiment described above. The external control device is configured to determine whether there is a failure in the main circuit by reading the diagnosis execution record and the diagnosis result from its own non-volatile memory when the semiconductor integrated circuit is powered on. The external control device is also configured to issue a command signal for shifting the state of the main circuit to the safe state to the main circuit when determining that there is a failure in the main circuit, and issue a command signal for making the main circuit start normal operation to the main circuit when determining that there is no failure in the main circuit.

With this configuration, the detection of a failure in the semiconductor integrated circuit can be made even when there is a restriction on the start-up time of the semiconductor integrated circuit, in a situation where a non-volatile memory cannot be installed in the semiconductor integrated circuit, by using the non-volatile memory of the external control device.

Fifth Embodiment

In a fifth embodiment of the present invention, a description is given on a semiconductor integrated circuit 10 that has the configurations of the first to fourth embodiments described above, except that the self-diagnosis circuit 12 is configured to execute the self-diagnosis processing a plurality of times. In the fifth embodiment, a description on aspects that are the same as those in the first to fourth embodiments described above is omitted, and differences from the first to fourth embodiments described above are mainly described.

Figure 8:
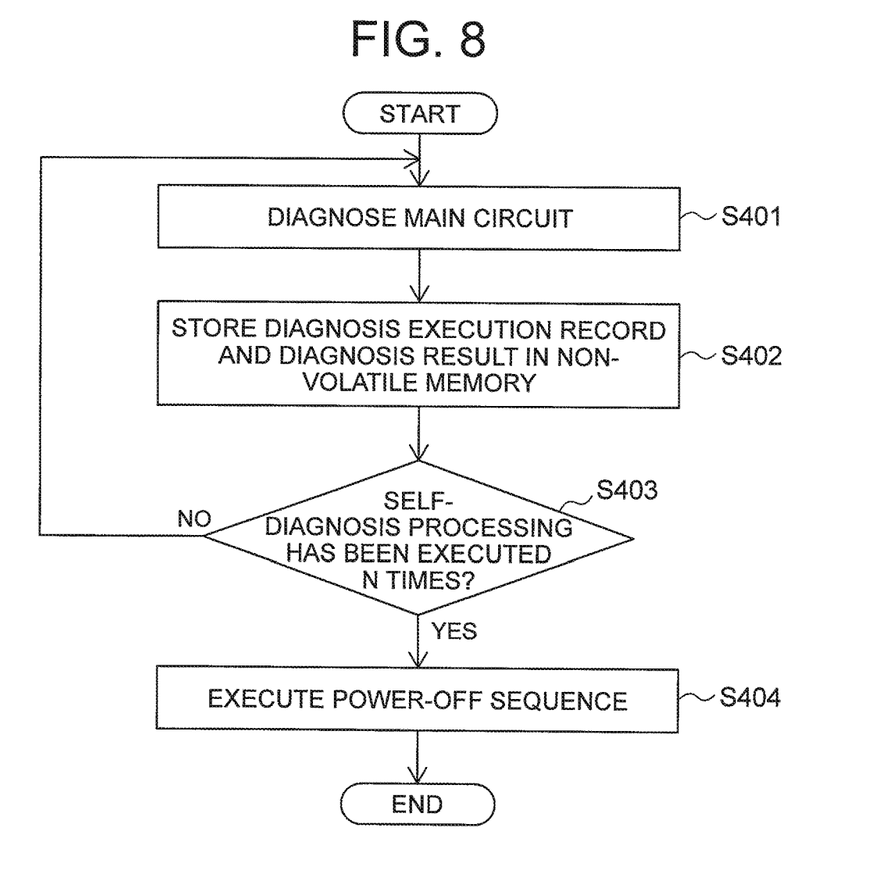
FIG. 8 is a flow chart for illustrating a series of steps of self-diagnosis processing that is executed by a self-diagnosis circuit of a semiconductor integrated circuit according to a fifth embodiment of the present invention.

FIG. 8 is a flow chart for illustrating a series of steps of self-diagnosis processing that is executed by the self-diagnosis circuit 12 of the semiconductor integrated circuit 10 according to the fifth embodiment of the present invention. The processing illustrated in the flow chart of FIG. 8 is executed when the semiconductor integrated circuit 10 is powered off.

In Step S401, the self-diagnosis circuit 12 diagnoses the main circuit 11. The processing then proceeds to Step S402.

In Step S402, the self-diagnosis circuit 12 stores, in the non-volatile memory 13 or 21, a diagnosis execution record, which indicates that the diagnosis conducted in Step S401 has been completed, and a diagnosis result, which indicates the outcome of the diagnosis conducted in Step S401. The processing then proceeds to Step S403.

In Step S403, the self-diagnosis circuit 12 determines whether the self-diagnosis processing has been executed N times. The value N is an integer equal to or more than 2, and is a value set in advance. When it is determined that the self-diagnosis processing has been executed N times, the processing proceeds to Step S404. When it is determined that the self-diagnosis processing has not been executed N times, on the other hand, the processing returns to Step S401 to execute Step S401 and subsequent steps again.

In Step S404, the self-diagnosis circuit 12 commands the main circuit 11 to execute a power-off sequence for powering off the semiconductor integrated circuit 10. The processing is then ended.

When the semiconductor integrated circuit 10 is powered on, the self-diagnosis circuit 12 reads the diagnosis execution records and diagnosis results of N times of self-diagnosis processing out of the non-volatile memory 13 or 21.

The self-diagnosis circuit 12 instructs the main circuit 11 to start normal operation when the diagnosis results of N times of self-diagnosis processing read out of the non-volatile memory 13 or 21 all indicate that there is no failure in the main circuit 11. When one of the diagnosis results of N times of self-diagnosis processing read out of the non-volatile memory 13 or 21 indicates that there is a failure in the main circuit 11, on the other hand, the self-diagnosis circuit 12 shifts the state of the main circuit 11 to the safe state.

As described above, according to the fifth embodiment, the semiconductor integrated circuit has the configurations of the first to fourth embodiments described above and is configured to repeat execution of the self-diagnosis processing a plurality of times. With this configuration, it is possible to detect a failure in the semiconductor integrated circuit even when noise causes the self-diagnosis circuit to malfunction.

Sixth Embodiment

In a sixth embodiment of the present invention, a description is given on a semiconductor integrated circuit 10 that includes a physical quantity detection circuit 16 in addition to the configuration of the second embodiment described above. In the sixth embodiment, a description on aspects that are the same as those in the first to fifth embodiments described above is omitted, and differences from the first to fifth embodiments described above are mainly described.

Figure 9:
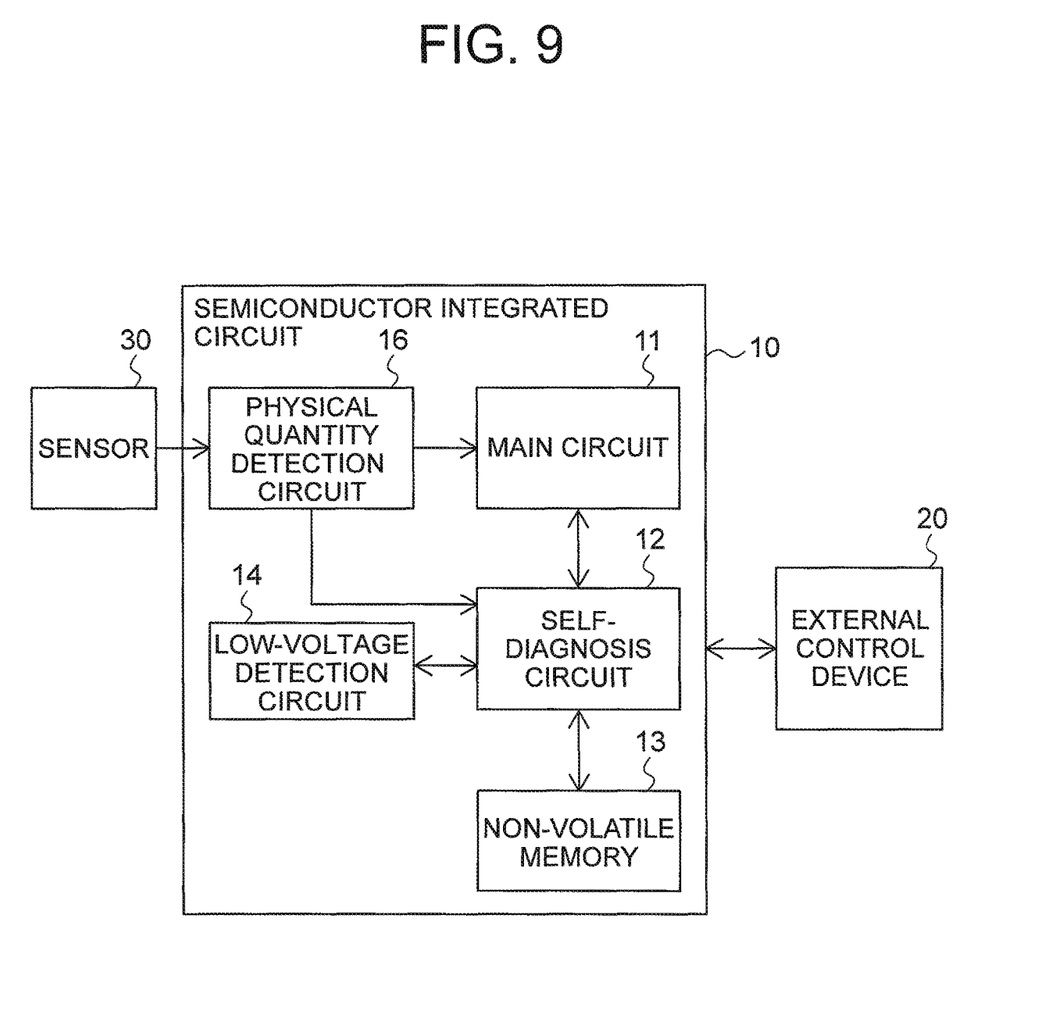
FIG. 9 is a block diagram for illustrating a semiconductor integrated circuit according to a sixth embodiment of the present invention.

FIG. 9 is a block diagram for illustrating the semiconductor integrated circuit 10 according to the sixth embodiment of the present invention. As illustrated in FIG. 9, the semiconductor integrated circuit 10 includes a main circuit 11, a self-diagnosis circuit 12, a non-volatile memory 13, a low-voltage detection circuit 14, and the physical quantity detection circuit 16.

The physical quantity detection circuit 16 processes a sensor signal input from a sensor 30, which detects various physical quantities, and outputs the processed sensor signal as an output signal to the main circuit 11 and the self-diagnosis circuit 12. The low-voltage detection circuit 14 outputs the start signal to the self-diagnosis circuit 12 when detecting a drop in the power supply voltage of the semiconductor integrated circuit 10.

Figure 10:
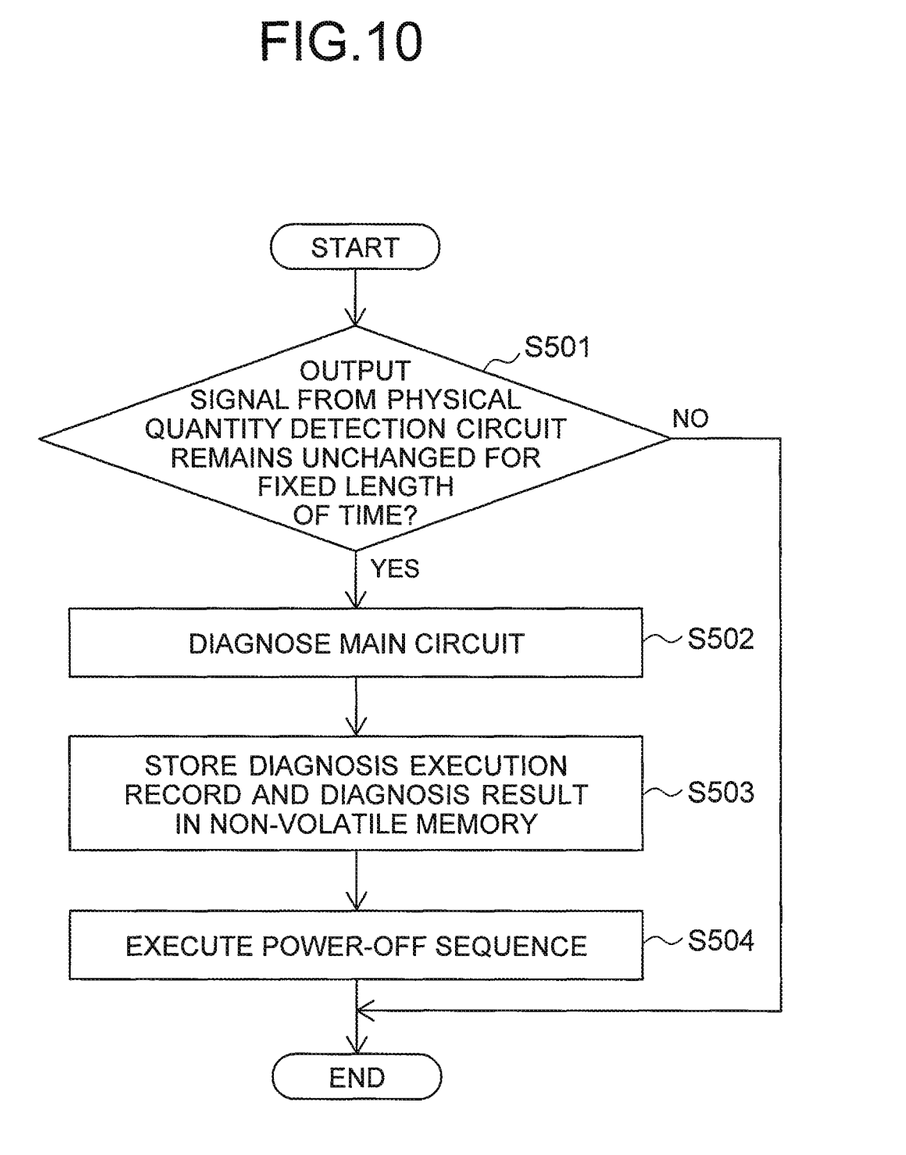
FIG. 10 is a flow chart for illustrating a series of steps of self-diagnosis processing that is executed by a self-diagnosis circuit of the semiconductor integrated circuit according to the sixth embodiment of the present invention.

FIG. 10 is a flow chart for illustrating a series of steps of self-diagnosis processing that is executed by the self-diagnosis circuit 12 of the semiconductor integrated circuit 10 according to the sixth embodiment of the present invention. The processing illustrated in the flow chart of FIG. 10 is executed when a drop in power supply voltage is detected by the low-voltage detection circuit 14.

In Step S501, the self-diagnosis circuit 12 determines whether an output signal from the physical quantity detection circuit 16 has remained unchanged for a fixed length of time.

In the case of a semiconductor integrated circuit installed with a function of processing a sensor signal, there is little change in the state of a target of detection by the sensor when the semiconductor integrated circuit is to be powered off in most times. Accordingly, a drop in power supply voltage due to disturbance noise can be prevented from causing a malfunction of the self-diagnosis circuit 12 with the use of a change in output signal from the physical quantity detection circuit 16 as a condition for the self-diagnosis circuit 12 to execute the self-diagnosis processing.

The set voltage B for detecting a drop in power supply voltage by the low-voltage detection circuit 14 may be set to a higher value in order to secure a longer length of time for the self-diagnosis circuit 12 to operate. The self-diagnosis processing can be executed stably as a result.

When it is determined in Step S501 that an output signal from the physical quantity detection circuit 16 has remained unchanged for the fixed length of time, the processing proceeds to Step S502. When it is determined that an output signal from the physical quantity detection circuit 16 has not remained unchanged for the fixed length of time, on the other hand, the processing is ended.

In Step S502, the self-diagnosis circuit 12 diagnoses the main circuit 11. The processing then proceeds to Step S503.

In Step S503, the self-diagnosis circuit 12 stores, in the non-volatile memory 13, a diagnosis execution record, which indicates that the diagnosis conducted in Step S502 has been completed, and a diagnosis result, which indicates the outcome of the diagnosis conducted in Step S502. The processing then proceeds to Step S504.

In Step S504, the self-diagnosis circuit 12 commands the main circuit 11 to execute a power-off sequence for powering off the semiconductor integrated circuit 10. The processing is then ended.

In this manner, the self-diagnosis circuit 12 executes the self-diagnosis processing when an output signal output from the physical quantity detection circuit 16 remains unchanged for the fixed length of time after the start signal is input from the low-voltage detection circuit 14.

The self-diagnosis circuit 12 may be configured to suspend the self-diagnosis processing when an output signal output from the physical quantity detection circuit 16 changes by an amount equal to or more than a fixed value while the self-diagnosis processing is being executed. This configuration enables the semiconductor integrated circuit 10 to return to a normal state even when noise superimposed on the power supply voltage, or the like, causes the self-diagnosis circuit 12 to malfunction while an output signal from the physical quantity detection circuit 16 remains unchanged for the fixed length of time.

As described above, according to the sixth embodiment, the semiconductor integrated circuit includes the physical quantity detection circuit, which processes a sensor signal input from a sensor and which outputs the processed sensor signal as an output signal, in addition to the configuration of the second embodiment described above. The self-diagnosis circuit is configured to start the execution of the self-diagnosis processing when an output signal output from the physical quantity detection circuit remains unchanged for a fixed length of time after the start signal is input. This prevents a drop in power supply voltage due to disturbance noise from causing a malfunction of the self-diagnosis circuit.

Seventh Embodiment

In a seventh embodiment of the present invention, a description is given on a case in which the semiconductor integrated circuit 10 according to one of the first to sixth embodiments described above is applied as a semiconductor integrated circuit to be included in a known rotation detection device. In the seventh embodiment, a description on aspects that are the same as those in the first to sixth embodiments described above is omitted, and differences from the first to sixth embodiments described above are mainly described.

Figure 11:
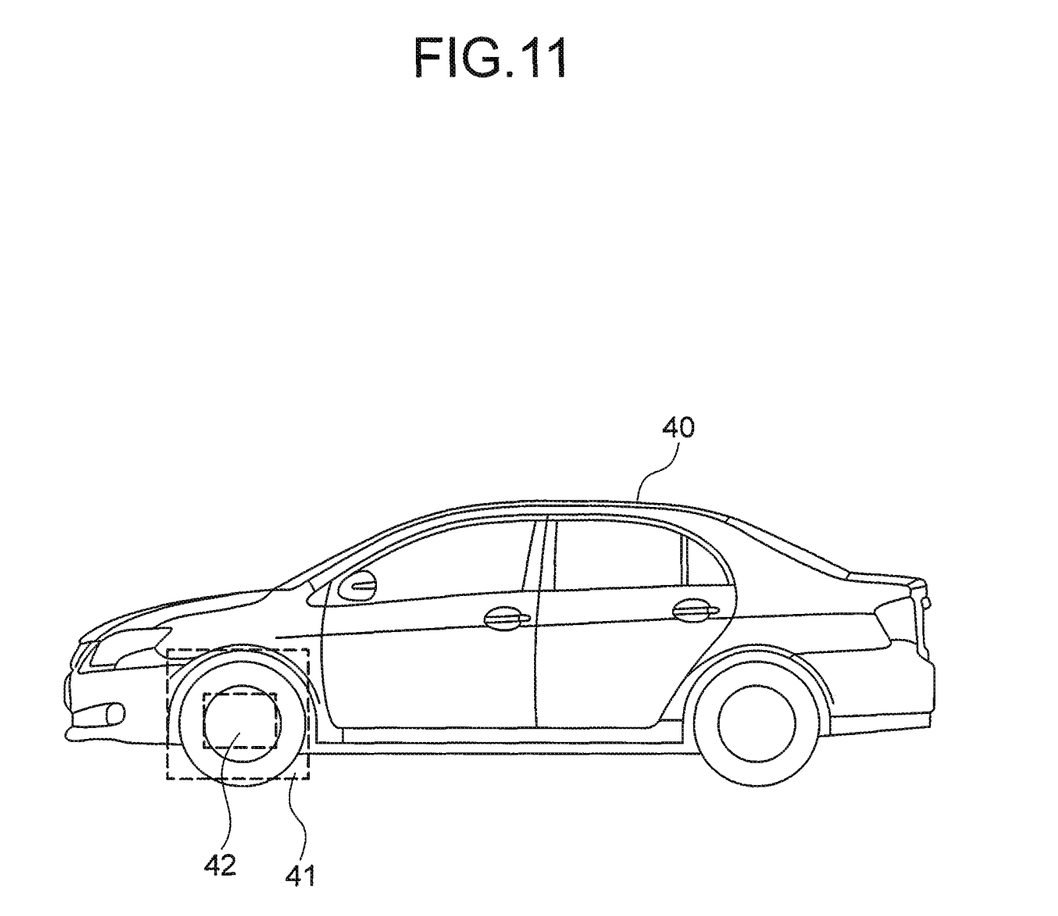
FIG. 11 is a diagram for illustrating the configuration of a vehicle in a seventh embodiment of the present invention.

FIG. 11 is a diagram for illustrating the configuration of a vehicle 40 in the seventh embodiment of the present invention. The vehicle 40 illustrated in FIG. 11 includes wheels 41 and a rotation detection device 42, which includes the semiconductor integrated circuit 10 according to one of the first to sixth embodiments described above. The rotation detection device 42 detects the rotation axis of rotating equipment mounted on the vehicle 40, for example, the rotation axis of the wheels 41.

It is required that the rotation detection device 42 and various other in-vehicle detection devices meet functional safety demands. It is also required to accurately grasp what state the vehicle's engine is in immediately after the engine is started. Various detection devices used to detect the engine state are therefore presented with tight restrictions on start-up time, and it is required for the various detection devices to start up in short time. This requirement is fulfilled by using the semiconductor integrated circuit 10 according to one of the first to sixth embodiments described above as a semiconductor integrated circuit included in the various detection devices.

The semiconductor integrated circuit 10 according to one of the first to sixth embodiments described above is thus applicable as a semiconductor integrated circuit to be included in a known rotation detection device.

As described above, in the seventh embodiment, there is adopted a configuration in which the semiconductor integrated circuit according to one of the first to sixth embodiments described above is applied as a semiconductor integrated circuit to be included in a known rotation detection device. A rotation detection device that meets functional safety demands is accomplished in this manner.

The functions of the self-diagnosis circuit 12 in the first to seventh embodiments described above are implemented by a processing circuit. The processing circuit implementing the functions may be dedicated hardware, or a processor that executes a program stored in a memory.

When the processing circuit is dedicated hardware, examples of the processing circuit include a single circuit, a composite circuit, a processor configured as a program, a processor configured as concurrent programs, an application-specific integrated circuit (ASIC), a field-programmable gate array (FPGA), and a combination thereof.

Meanwhile, when the processing circuit is a processor, the function of the self-diagnosis circuit 12 is implemented by software, firmware, or a combination of software and firmware. The software and the firmware are described as programs, and are stored in the memory. The processor implements the functions of the self-diagnosis circuit 12 by reading the programs stored in the memory and executing the programs.

In this case, the memory corresponds to, for example, a random access memory (RAM), a read only memory (ROM), a flash memory, an erasable programmable read only memory (EPROM), an electrically erasable and programmable read only memory (EEPROM), or other such nonvolatile or volatile semiconductor memory. The memory also corresponds to a magnetic disk, a flexible disk, an optical disc, a Compact Disc, a MiniDisc, a DVD, or other such medium.

The processing circuit can implement the functions of the self-diagnosis circuit 12 described above by hardware, software, firmware, or a combination thereof.

The first to seventh embodiments have been described as examples of the present invention, but the present invention is not limited to the configurations of the first to seventh embodiments. Within the scope not deviating from the gist of the present invention, the configurations of the first to seventh embodiments can be combined as appropriate, or can be modified partially or omitted partially.

What is claimed is:

1. A semiconductor integrated circuit, comprising:
    a main circuit;
    a non-volatile memory; and
    a self-diagnosis circuit configured to execute, when the semiconductor integrated circuit is to be powered off, self-diagnosis processing in which the main circuit is diagnosed and a diagnosis execution record indicating whether the diagnosis is completed and a diagnosis result indicating a result of the diagnosis are stored in the non-volatile memory,
    wherein the self-diagnosis circuit is configured to:
        determine, when the semiconductor integrated circuit is powered on, whether there is a failure in the main circuit by reading the diagnosis execution record and the diagnosis result out of the non-volatile memory; and
        shift a state of the main circuit to a safe state when determining that there is a failure in the main circuit, and instruct the main circuit to start normal operation when determining that there is no failure in the main circuit.

2. The semiconductor integrated circuit according to claim 1, further comprising a low-voltage detection circuit configured to output a start signal when detecting a drop in power supply voltage to a set voltage,
    wherein the self-diagnosis circuit is configured to start execution of the self-diagnosis processing when the start signal is input to the self-diagnosis circuit.

3. The semiconductor integrated circuit according to claim 2, further comprising a voltage holding circuit configured to prevent the power supply voltage from dropping.

4. The semiconductor integrated circuit according to claim 3,
    wherein the low-voltage detection circuit is configured to output a detection signal as well as the start signal when detecting that the power supply voltage has dropped to the set voltage, and
    wherein the voltage holding circuit is configured to stop operation of a particular circuit in the main circuit when the detection signal is input to the voltage holding circuit.

5. The semiconductor integrated circuit according to claim 3, wherein the voltage holding circuit includes a capacitor.

6. The semiconductor integrated circuit according to claim 2, further comprising a physical quantity detection circuit configured to process a sensor signal, which is input from a sensor, and output the processed sensor signal as an output signal,
    wherein the self-diagnosis circuit is configured to start execution of the self-diagnosis processing when the output signal output from the physical quantity detection circuit remains unchanged for a fixed length of time after the start signal is input to the self-diagnosis circuit.

7. The semiconductor integrated circuit according to claim 6, wherein the self-diagnosis circuit is configured to suspend the self-diagnosis processing when the output signal output from the physical quantity detection circuit changes by an amount equal to or more than a fixed value while the self-diagnosis processing is being executed.

8. The semiconductor integrated circuit according to claim 1, wherein the self-diagnosis circuit is configured to repeat execution of the self-diagnosis processing a plurality of times.

9. A semiconductor integrated circuit, comprising:
    a main circuit; and
    a self-diagnosis circuit configured to execute, when the semiconductor integrated circuit is to be powered off, self-diagnosis processing in which the main circuit is diagnosed and a diagnosis execution record indicating whether the diagnosis is completed and a diagnosis result indicating a result of the diagnosis are stored in a non-volatile memory of an external control device,
    wherein the external control device is configured to:
        determine, when the semiconductor integrated circuit is powered on, whether there is a failure in the main circuit by reading the diagnosis execution record and the diagnosis result out of the non-volatile memory; and
        issue a command signal for shifting a state of the main circuit to a safe state to the main circuit when determining that there is a failure in the main circuit, and issue a command signal for causing the main circuit to start normal operation to the main circuit when determining that there is no failure in the main circuit.

10. The semiconductor integrated circuit according to claim 9, further comprising a low-voltage detection circuit configured to output a start signal when detecting a drop in power supply voltage to a set voltage,
    wherein the self-diagnosis circuit is configured to start execution of the self-diagnosis processing when the start signal is input to the self-diagnosis circuit.

11. The semiconductor integrated circuit according to claim 10, further comprising a voltage holding circuit configured to prevent the power supply voltage from dropping.

12. The semiconductor integrated circuit according to claim 11,
    wherein the low-voltage detection circuit is configured to output a detection signal as well as the start signal when detecting that the power supply voltage has dropped to the set voltage, and
    wherein the voltage holding circuit is configured to stop operation of a particular circuit in the main circuit when the detection signal is input to the voltage holding circuit.

13. The semiconductor integrated circuit according to claim 11, wherein the voltage holding circuit includes a capacitor.

14. The semiconductor integrated circuit according to claim 10, further comprising a physical quantity detection circuit configured to process a sensor signal, which is input from a sensor, and output the processed sensor signal as an output signal,
    wherein the self-diagnosis circuit is configured to start execution of the self-diagnosis processing when the output signal output from the physical quantity detection circuit remains unchanged for a fixed length of time after the start signal is input to the self-diagnosis circuit.

15. The semiconductor integrated circuit according to claim 14, wherein the self-diagnosis circuit is configured to suspend the self-diagnosis processing when the output signal output from the physical quantity detection circuit changes by an amount equal to or more than a fixed value while the self-diagnosis processing is being executed.

16. The semiconductor integrated circuit according to claim 9, wherein the self-diagnosis circuit is configured to repeat execution of the self-diagnosis processing a plurality of times.

17. A rotation detection device, comprising:
a semiconductor integrated circuit, including:
a main circuit;
a non-volatile memory; and
a self-diagnosis circuit configured to execute, when the semiconductor integrated circuit is to be powered off, self-diagnosis processing in which the main circuit is diagnosed and a diagnosis execution record indicating whether the diagnosis is completed and a diagnosis result indicating a result of the diagnosis are stored in the non-volatile memory,
wherein the self-diagnosis circuit is configured to:
  determine, when the semiconductor integrated circuit is powered on, whether there is a failure in the main circuit by reading the diagnosis execution record and the diagnosis result out of the non-volatile memory; and
  shift a state of the main circuit to a safe state when determining that there is a failure in the main circuit, and instruct the main circuit to start normal operation when determining that there is no failure in the main circuit.

\* \* \* \* \*